US009362452B2

(12) United States Patent
Chang et al.

(10) Patent No.: US 9,362,452 B2
(45) Date of Patent: Jun. 7, 2016

(54) LIGHT-EMITTING DEVICE AND THE MANUFACTURING METHOD THEREOF

(71) Applicant: EPISTAR CORPORATION, Hsinchu (TW)

(72) Inventors: Shih Pang Chang, Hsinchu (TW); Ta Cheng Hsu, Hsinchu (TW); Min Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/918,374

(22) Filed: Jun. 14, 2013

(65) Prior Publication Data

US 2014/0367692 A1 Dec. 18, 2014

(51) Int. Cl.
*H01L 33/22* (2010.01)
*H01L 33/00* (2010.01)

(52) U.S. Cl.
CPC .............. *H01L 33/22* (2013.01); *H01L 33/007* (2013.01)

(58) Field of Classification Search
CPC ....... H01L 33/22; H01L 33/20; H01L 33/105; H01L 33/12; H01L 2933/0091; H01L 2933/0083
See application file for complete search history.

(56) References Cited

U.S. PATENT DOCUMENTS

| | | | | |
|---|---|---|---|---|
| 7,977,223 | B2 | 7/2011 | Byun et al. | |
| 2010/0065865 | A1 * | 3/2010 | Byun et al. | 257/94 |
| 2010/0102353 | A1 * | 4/2010 | Park | 257/98 |
| 2011/0108798 | A1 * | 5/2011 | Song | 257/13 |
| 2012/0018758 | A1 | 1/2012 | Matioli et al. | |

FOREIGN PATENT DOCUMENTS

CN 102034907 4/2011

OTHER PUBLICATIONS

Sheu et al., "Enhanced Light Output of GaN-Based Light-Emitting Diodes with Embedded Voids Formed on Si-Implanted GaN Layers", IEEE Electron Device Letters, Oct. 2011, pp. 1400-1402, vol. 32, No. 10.

* cited by examiner

*Primary Examiner* — Evan Pert
*Assistant Examiner* — Leslie Pilar Cruz
(74) *Attorney, Agent, or Firm* — Muncy, Geissler, Olds & Lowe, P.C.

(57) ABSTRACT

A light-emitting device includes: a substrate including an upper surface, wherein the upper surface includes an ion implantation region; a semiconductor layer formed on the upper surface; a light-emitting stack formed on the semiconductor layer; and a plurality of scattering cavities formed between the semiconductor layer and the upper surface in accordance with the ion implantation region.

12 Claims, 6 Drawing Sheets

LIGHT-EMITTING DEVICE AND THE MANUFACTURING METHOD THEREOF

TECHNICAL FIELD

The application relates to a light-emitting device, in particular, relates to a light-emitting device including scattering cavities therein resulting from ion implantation.

DESCRIPTION OF BACKGROUND ART

The lighting theory and structure of light-emitting diode (LED) is different from that of conventional lighting source. An LED has advantages as a low power loss, a long life-time, no need for warming time, and fast responsive time. Moreover, it is small, shockproof, suitable for mass production, so LEDs are widely adopted in the market. For example, LEDs can be used in optical display apparatus, laser diodes, traffic lights, data storage devices, communication devices, illumination devices, medical devices, and so on.

A light-emitting device may include a substrate, a light-emitting stack including an n-type semiconductor layer, an active layer, and a p-type semiconductor layer. The light-emitting stack may have roughened structure on the surface or the substrate thereof to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A light-emitting device includes: a substrate including an upper surface, wherein the upper surface includes an ion implantation region; a semiconductor layer formed on the upper surface; a light-emitting stack formed on the semiconductor layer; and a plurality of scattering cavities formed between the semiconductor layer and the upper surface in accordance with the ion implantation region.

A method for manufacturing a light-emitting device includes steps of: providing a substrate including an upper surface; forming an ion implantation region on the upper surface; forming a semiconductor stack on the upper surface by epitaxial growth, and forming a plurality of scattering cavities between the semiconductor stack and the substrate.

DETAILED DESCRIPTION OF PREFERRED EMBODIMENTS

Figure 1A:
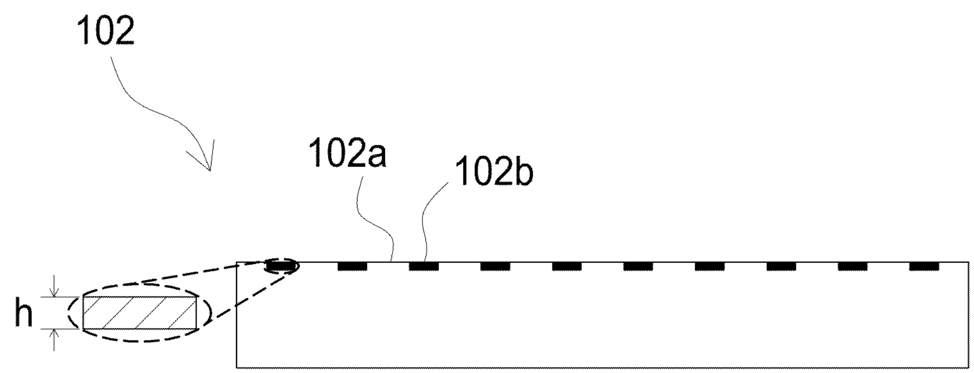
FIGS. 1A to 1F show a manufacturing method of a light-emitting device in accordance with a first embodiment of the present application.
Figure 1B:
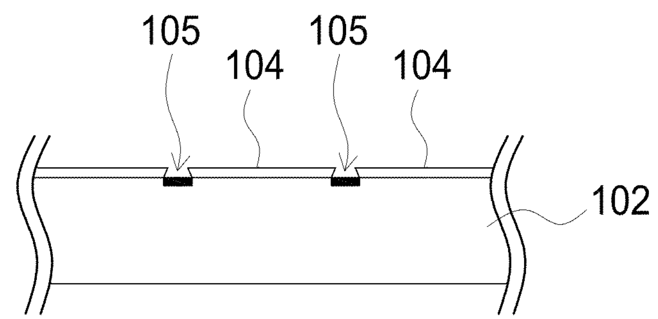
Figure 1C:
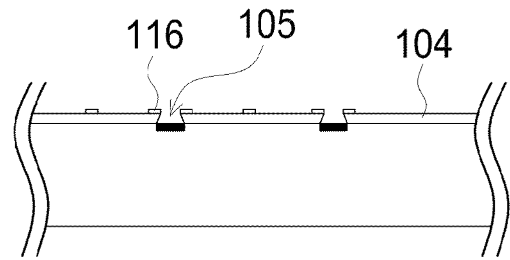
Figure 1D:
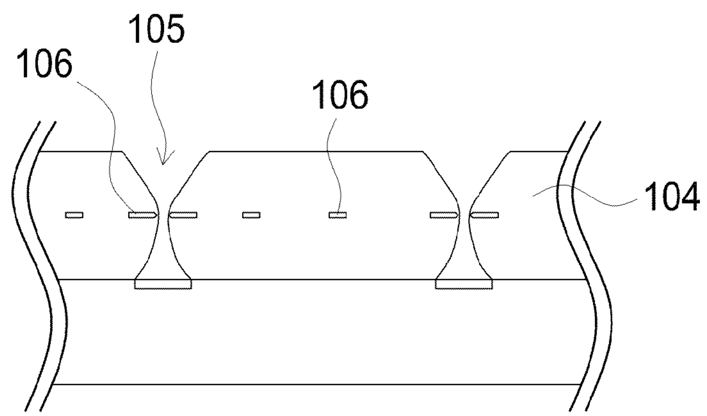
Figure 1E:
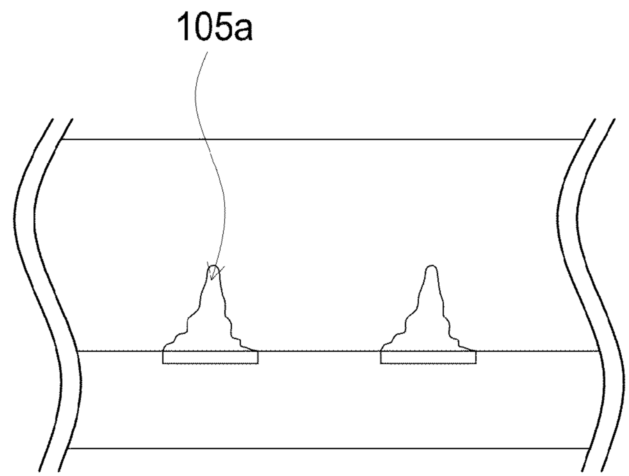
Figure 1F:
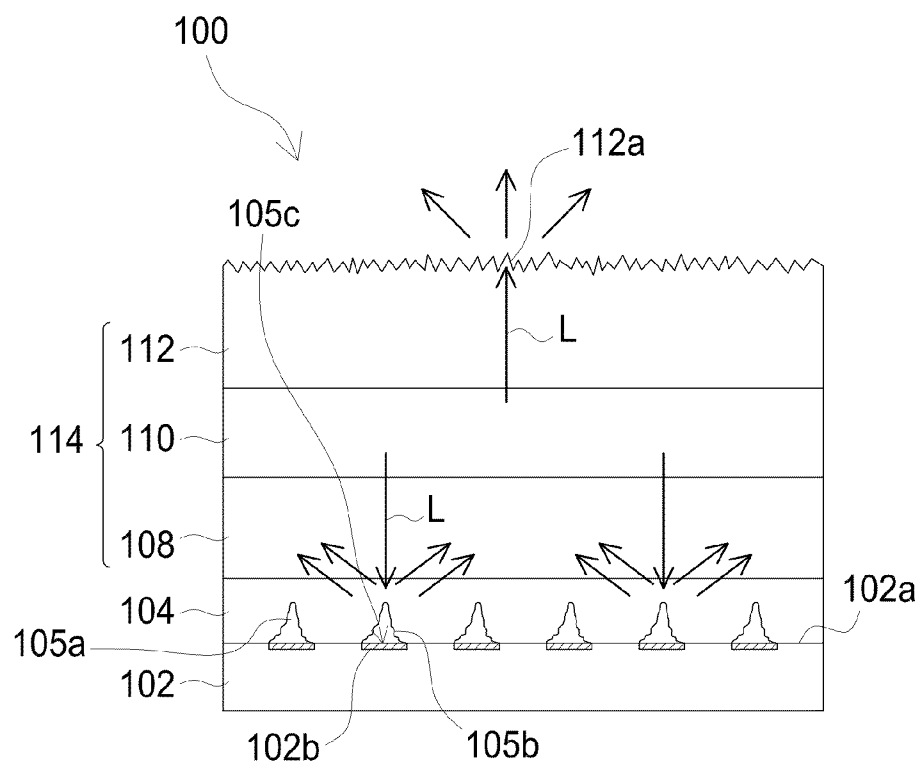

Referring to FIGS. 1A to 1E, a manufacturing method of a light-emitting device in accordance with a first embodiment of the present application is disclosed. As shown in FIG. 1A, a substrate 102 including an upper surface 102*a* is provided, and an ion implantation region 102*b* can be formed on the upper surface 102*a*. The ion implantation region 102*b* can be formed by implanting an ion into the substrate, and the ion can be Ar, Si, o, N, C and the combination thereof, and in the embodiment, the ion can be AR. The ion implantation region 102*b* can have a thickness h between 10 nM to 50 nm, and the ion implantation region 102*b* can be formed with an ion implantation dose between 1E15 ions/$cm^2$ and 1E17 ions/$cm^2$. The substrate 102 can be a single-layer and single-crystalline substrate including sapphire, Si or SiC. The ion implantation region 102*b* with a dot-like pattern forms amorphization on partial area of the upper surface 102*a* of the substrate 102. In the embodiment, the substrate 102 is sapphire, and a nitride based semiconductor can be grown on the upper surface 102*a*. Before forming the ion implantation region 102*b*, a mask (not shown) with a pattern can be formed on the upper surface 102*a*, and ion implantation region 102*b* can be formed in accordance with the pattern of the mask. As shown in FIG. 1B, the substrate 102 can be disposed in an MOCVD chamber (not shown), then a semiconductor layer 104 is formed on the upper surface 102*a* of the substrate 102 by epitaxial growth. Because of the amorphization of the ion implantation regions 102*b*, the epitaxial growth rate on a region other than the implantation regions 102*b* is faster than that on the implantation regions 102*b*, therefore a plurality of openings 105 is formed. The semiconductor layer 104 serves as a buffer layer to reduce the lattice mismatch between the substrate 102 and a light-emitting stack, and the material of the semiconductor layer 104 can be an undoped GaN or un-intentionally doped GaN. Along the growth of the semiconductor layer 104, the cross-sectional area of each of the openings 105 is gradually smaller from bottom to top. A seed layer (not shown) such as AlN can be formed on the upper surface 102*a* of the substrate 102 before the semiconductor layer 104 is formed. As shown in FIG. 1C, epitaxial growth of the semiconductor layer 104 is paused after the semiconductor layer 104 reach a thickness of about 200 nm to 600 nm, then a barrier section 106 can be formed on the semiconductor layer 104 by deposition in the MOCVD chamber. The amount of the deposited barrier section 106 is small so the barrier section 106 covers only partial regions of the semiconductor layer 104. The barrier section 106 can be formed of non-crystalline material such as $SiN_x$, and in accordance with the existence of the openings 105, the barrier section 106 can surround each of the openings from top view. As shown in FIG, 1D, after forming the barrier section 106, the epitaxial growth of the semiconductor layer 104 is resumed. The epitaxial growth of the semiconductor layer 104 nearby each opening 105 includes a growing direction laterally toward the opening 105, therefore the opening 105 can be eventually closed by the semiconductor layer 104. Because of the barrier section 106 embedded in the semiconductor layer 104, the growing direction of the semiconductor layer 104 nearby the openings 105 can be temporarily changed so the openings 105 can be developed to a desired height before forming a closed end. The process of embedding the barrier section 106 in the semiconductor layer 104 can be performed for 1 to 100 cycles, and the semiconductor layer 104 can be grown with a thickness of between 10 nm to 50 nm during each cycle. As shown in FIG. 1E, the openings 105 in FIG. 1D are closed when the semiconductor layer 104 is grown to reach a thickness of about 2.5 μm to 3 μm, and a plurality of scattering cavities 105*a* can be formed. As shown in FIG. 1F, a light-emitting stack 114 which includes an n-type semiconductor layer 108, an active layer 110, and a p-type semiconductor layer 112 in the embodiment can be formed on the semiconductor layer 104. The electrons provided from the n-type semiconductor layer 108 and the holes provided from the p-type semiconductor layer 112 combine in the active layer 110 to emit light L under an external electrical driving current, and light L emitted from the active layer 110 can be scattered by the scattering cavities 105*a* so the light-extraction of the light-emitting device 100 can be enhanced. In the embodiment, the ion implantation region 102*b* is amorphous, and the scattering cavities 105*a* are directly on the ion implantation region 102*b*. Each of the scattering cavities 105*a* includes a bottom surface 105*b* being a region of the upper surface 102*a* of the substrate 102 and a side surface 105*c* connected to the bottom surface 105*b*. The p-type semiconductor layer 112 can have an uneven upper surface 112*a* for scattering the light L from the active layer 110. The light-emitting stack 114 can include nitride based semiconductor, and in the embodiment, the light-emitting stack 114 can be GaN. The form of each of the cavities 105*a* can be cone, pyramid or other forms having a wide bottom and a narrow top.

Figure 2:
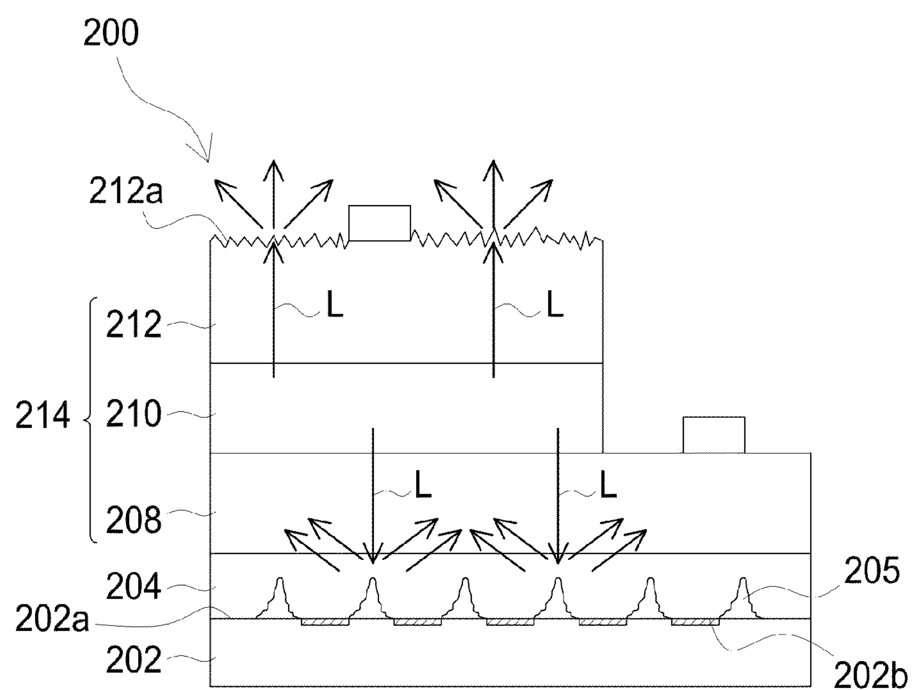
FIG. 2 shows a light-emitting device in accordance with a second embodiment of the present application.
Figure 3A:
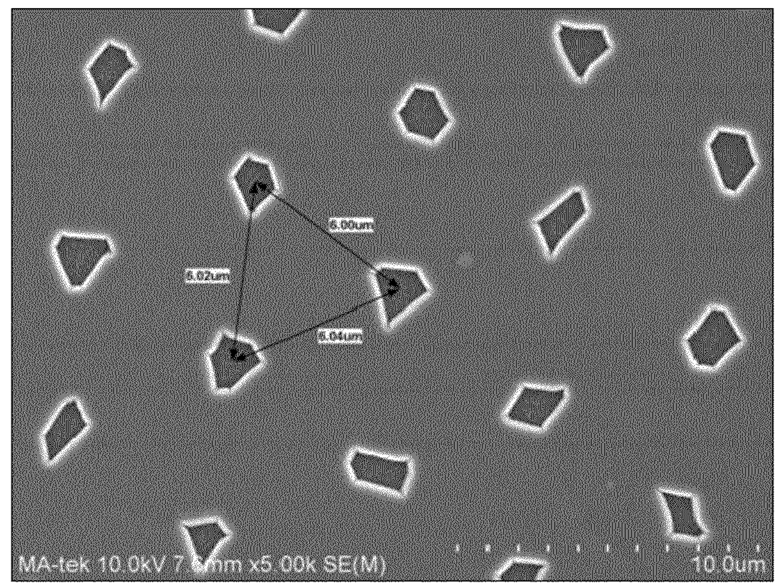
FIGS. 3A to 3F show three groups of scanning electron microscope photos in accordance with three different densities of the scattering cavities disclosed in the embodiments of the present application.
Figure 3B:
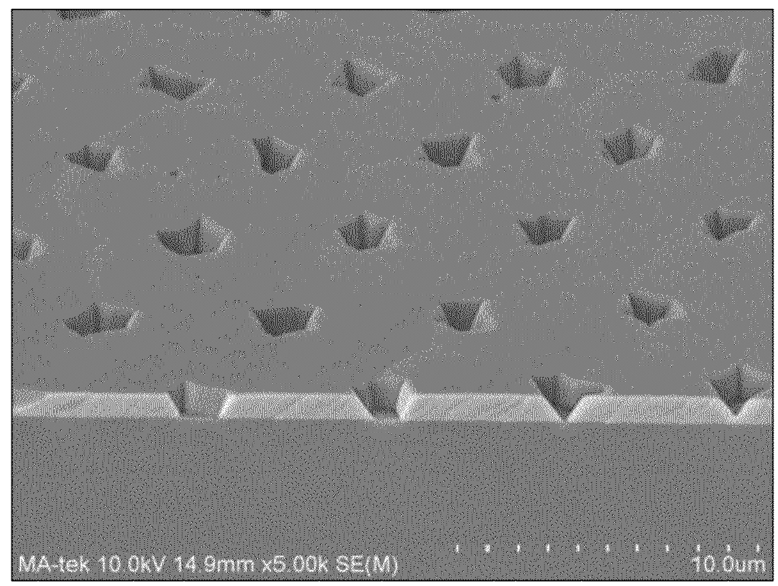
Figure 3C:
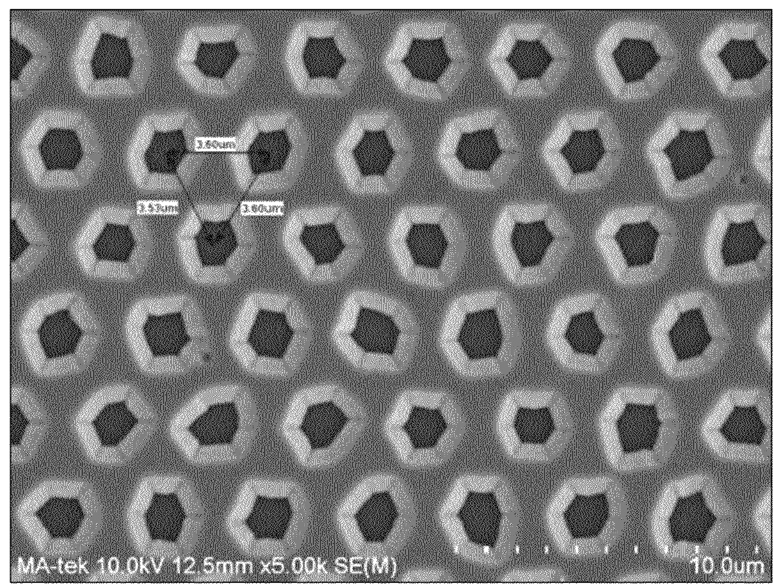
Figure 3D:
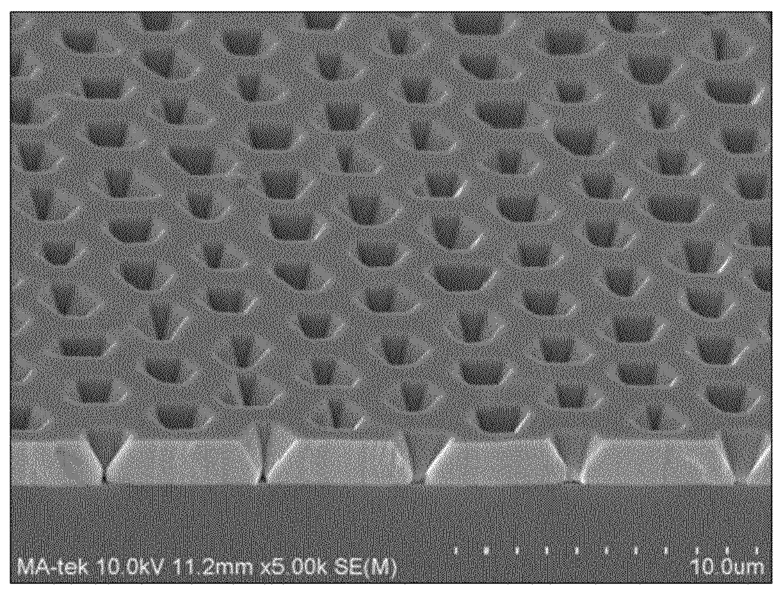
Figure 3E:
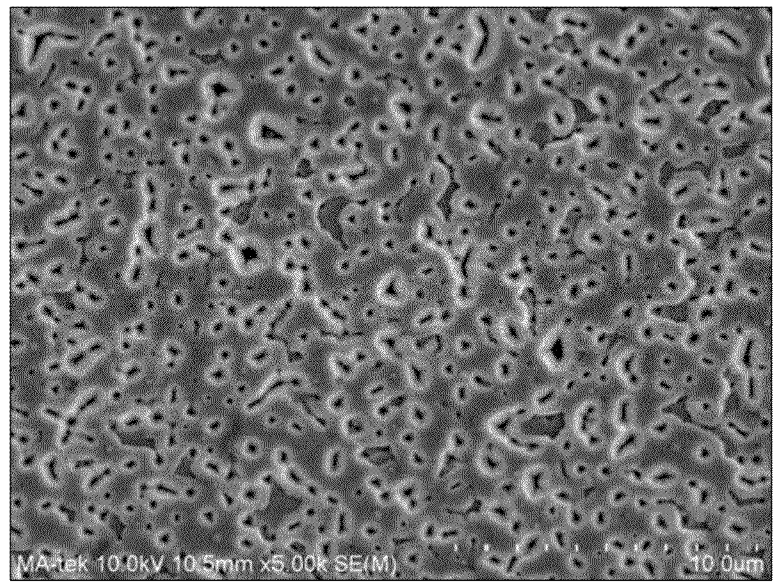
Figure 3F:
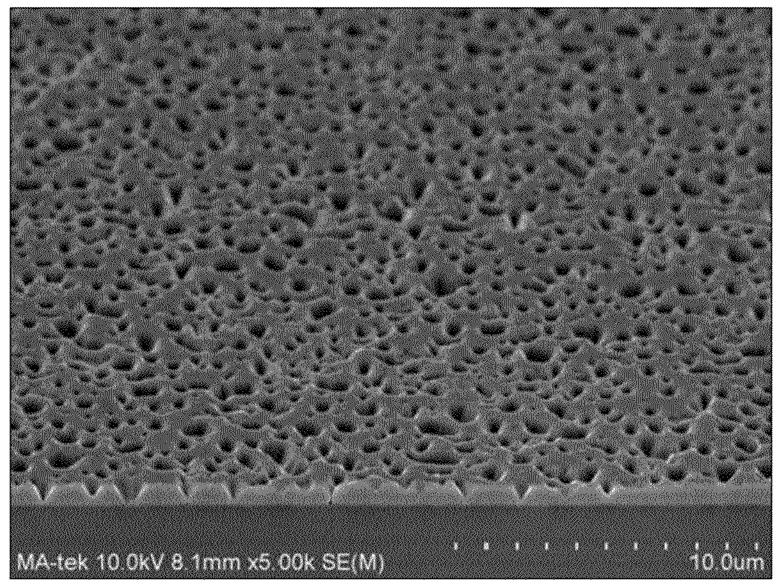

Referring to FIG. 2, a light-emitting device in accordance with a second embodiment of the present application is disclosed. A light-emitting device 200 includes: a substrate 202 including an upper surface 202*a*; an ion implantation region 202*b* formed on the upper surface 202*a*; a semiconductor layer 204 formed on the upper surface 202*a*; a light-emitting stack 214 formed on the semiconductor layer 204; and a plurality of scattering cavities 205 formed between the semiconductor layer 204 and the upper surface 202*a* in accordance with the ion implantation region 202*b* and configured to scatter the light L emitted from the light-emitting stack 214. The difference between the embodiment and the first embodiment is that the ion implantation region 202*b* forms a crystallized region for epitaxial growth and has a mesh-like pattern from top view, and the scattering cavities 205 are formed on the upper surface 202*a* rather than the ion implantation region 202*b*. In the embodiment, the light-emitting stack 214 includes an n-type semiconductor layer 208 formed on the semiconductor layer 204, an active layer 210 formed on the n-type semiconductor layer, and a p-type semiconductor layer 212 formed on the active layer 210. The p-type semiconductor layer 212 includes an uneven upper surface 212*a* being a primary surface for extracting light L emitted from the active layer 210, and the roughness of the uneven upper surface 212*a* is for scattering light L emitted from the active layer 210.

Referring to FIGS. 3A to 3F, a couple sets of scanning electron microscope photos shows different densities of the scattering cavities disclosed in the embodiments of the present application are shown. FIGS. 3A and 3B, FIGS. 3C and 3D, and FIGS. 3E and 3F represent three sets of different densities of the scattering cavities, respectively. The scattering cavities are arranged in hexagonal close-packed with a predetermined pitch between two adjacent scattering cavities.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:

a substrate comprising an upper surface, wherein the upper surface comprises an ion implantation region;

a semiconductor layer formed on the upper surface;

a light-emitting stack formed on the semiconductor layer;

a plurality of scattering cavities formed between the semiconductor layer and the upper surface in accordance with the ion implantation region; and a barrier section distributed in the semiconductor layer.

2. The light-emitting device according to claim 1, wherein the substrate is a single layer.

3. The light-emitting device according to claim 1, wherein the substrate comprises a single-crystalline material and the light-emitting stack comprises nitride based semiconductor.

4. The light-emitting device according to claim 1, wherein the scattering cavities are formed on the upper surface of the substrate rather than the ion implantation region.

5. The light-emitting device according to claim 1, wherein the scattering cavities are formed on the ion implantation region.

6. The light-emitting device according to claim 1, wherein the ion implantation region is formed by ion implantation dose between $1E^{15}$ ions/$cm^2$ and $1E^{17}$ ions/$cm^2$.

7. The light-emitting device according to claim 1, wherein each of the scattering cavities has a bottom surface being a region of the upper surface of the substrate and a side surface connected to the bottom surface.

8. The light-emitting device according to claim 1, wherein the barrier section is non-crystalline.

9. The light-emitting device according to claim 1, wherein the barrier section surrounds each of the scattering cavities from top view.

10. The light-emitting device according to claim 1, wherein the barrier section comprises SiNx.

11. The light-emitting device according to claim 1, wherein the light-emitting stack comprises GaN.

12. The light-emitting device according to claim 1, wherein the light-emitting stack comprises a first side adjacent to the upper surface of the substrate and a second side opposite to the first side, and the second side comprises an uneven structure scattering the light emitted from the light-emitting stack.

* * * * *